United States Patent [19]
Ng et al.

[11] Patent Number: 6,005,811
[45] Date of Patent: *Dec. 21, 1999

[54] METHOD FOR OPERATING A MEMORY

[75] Inventors: Sunny T. Ng, Palo Alto; Tuan Nguyen, Saratoga, both of Calif.

[73] Assignee: Oak Technology, Incorporated, Sunnyvale, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/026,886

[22] Filed: Feb. 19, 1998

Related U.S. Application Data

[62] Division of application No. 08/733,344, Oct. 17, 1996, Pat. No. 5,793,663, which is a continuation of application No. 08/291,615, Aug. 17, 1994, abandoned.

[51] Int. Cl.$^6$ .................................................. G11C 15/00
[52] U.S. Cl. ...................................................... 365/189.05
[58] Field of Search ........................ 365/189.04, 189.05, 365/189.12, 193, 238.5, 222, 49

[56] References Cited

U.S. PATENT DOCUMENTS

| | | | |
|---|---|---|---|
| 4,959,811 | 9/1990 | Szczepanek | 365/49 |
| 4,961,171 | 10/1990 | Pinkham | 365/230.05 |
| 5,088,062 | 2/1992 | Shikata | 365/189.05 |
| 5,111,386 | 5/1992 | Fujishima et al. | 395/425 |
| 5,179,372 | 1/1993 | West et al. | 340/799 |
| 5,206,833 | 4/1993 | Lee | 365/233 |
| 5,210,723 | 5/1993 | Bates et al. | 365/238.5 |
| 5,530,955 | 6/1996 | Kaneko | 365/230.02 |

FOREIGN PATENT DOCUMENTS 0 220 535   5/1987   European Pat. Off. .

*Primary Examiner*—A. Zarabian
*Attorney, Agent, or Firm*—Steven F. Caserza; Flehr Hohbach Test Albritton and Herbert

[57] ABSTRACT

A memory system is able to simultaneously access multiple rows in page mode operation. The multiple page memory includes a memory array with multiple internal read registers to improve the effective page cycle time. The multiple page memory of this invention is very effective in graphics applications where multiple page memory access is required. A memory with multiple page random access in accordance with this invention greatly enhances performance by allowing different sources to continue to access the memory in the page mode, in spite of intervening memory accesses by other sources to other rows of the memory. A VRAM with multiple page random access in accordance with this invention provides an even higher performance graphic memory system.

9 Claims, 13 Drawing Sheets

NOTE:

1. WRITEHIT SIGNAL IS USED TO CONTROL WEn AT THE FALLING EDGE OF RASn. IF WRITEHIT=1 THEN WEn=1 AND THE READ REGISTER IS RELOADED. IF WRITEHIT=0 THEN WEn=0 AND THE READ REGISTER IS NOT RELOADED.

2. READHIT SIGNAL IS USED TO DETERMINE WHETHER THE READ OPERATION REQUIRES A RELOAD (FULL RAS/CAS CYCLE).

METHOD FOR OPERATING A MEMORY

CROSS REFERENCE TO RELATED APPLICATIONS

This application is a division of U.S. patent application Ser. No. 08/733,344 filed Oct. 17, 1996, now U.S. Pat. No. 5,793,663 which is a continuation of U.S. patent application Ser. No. 08/291,615, filed Aug. 17, 1994 now abandoned.

TECHNICAL FIELD

This invention pertains to memory systems, and more specifically to memory systems having high bandwidth and thus suitable for use as, for example, graphic memory systems.

BACKGROUND

Computer systems and memory systems are well known, and it has been a continuing struggle to provide memory systems with sufficient capacity and sufficient bandwidth to service their associated CPUs and other system components. In a simple computer system, the CPU accesses either memory (such as semiconductor memory, such as static RAMS or dynamic RAMS), and mass storage space, such as disc drives. With increasing speeds available in modern CPUs and peripheral devices such as graphic controllers and direct memory access (DMA) controllers, more and more manipulation is performed in memory, rather than mass storage, due to the significantly greater access speed, and thus bandwidth, of semiconductor memories. Furthermore, with increasing system speed and a greater number of system components capable of reading and writing to the same memory, memory bandwidth requirements have increased dramatically over time. This increased demand placed upon the memory is particularly acute with respect to graphical applications, which over time has significantly increased in resolution and color depth.

With higher resolution and more color depth, the bandwidth requirement for a graphic memory system is tremendous. Prior art graphic memory system architecture typically consists of two sources competing for the memory bus, as shown in the block diagram of FIG. 1. In order to access that portion of the memory which stores the information associated with screen video, that portion of the memory being referred to as the video frame buffer. These two sources competing for the memory bus with respect to graphical needs are the memory reads required for screen refresh, and the memory read/write cycles initiated by the CPU to access the video frame buffer to update the contents of the video frame buffer (or other graphical device.)

To alleviate the competition for the memory bus, the Video RAM (VRAM) was created, which includes a parallel-in/serial-out data register connected to a second data port, and including its own data clock. This second port allows data to be transferred out of the chip at high speed, for example to control the video display, and occurs in parallel with normal reads from and writes to the VRAM, thereby allowing the CPU or other graphical devices to simultaneously manipulate the data within the VRAM without contention problems. Video RAMS are described, for example, in Computer Graphics Principles and Practice, 2nd ed., Foley, van Dam, Finer and Hughes, Addison-Wesley Publishing Co., 1992, pp. 856–862, Section 18.1.4.

DRAM is also usable as a graphic memory when there is an adequate buffer (FIFO) used for screen refresh as well as read ahead and write buffers for the CPU reads and writes. When using DRAM as a graphic memory, buffering is used to allow the DRAM to operate in the page mode as much as possible. When operating a DRAM, a row address is first strobed into the device, followed by a column address, as described in Computer Graphics Principles and Practice, 2nd ed., Foley, van Dam,—Finer and Hughes, Addison-Wesley Publishing Co., 1992, pp. 856–862, Section 18.1.2. A row address defines a plurality of words contained on that row, which plurality of data words can be read out sequentially utilizing a plurality of column addresses, strobes without a requirement for an additional row address strobe. Thus, the plurality of words contained within a row can be quickly read out of the DRAM operating in the page mode (i.e. the words contained in a single ram of the DRAM are all contained on the same "page".) When operating a DRAM in the page mode the number of consecutive page cycles possible depends on the depth of the FIFO, (i.e. the number of words within a row which can be stored in FIFO in response to "a RAS" strobe.) Furthermore, when using a DRAM in the page mode, random cycle (RAS strobe) will most likely be required each time a new source takes over the memory bus or there is a switch from a CPU read operation to a CPU write operation.

More recently, in addition to the CPU being capable of accessing the video buffer, as well as the screen refresh circuitry, certain graphic memory systems include a dedicated graphic engine to draw directly into the memory introducing a third source to compete for the memory bus. As depicted in FIG. 2, such a DRAM system 200 includes DRAM 201, memory controller 210, and a plurality of devices interfacing with memory controller 210. Such devices which compete for DRAM 201 bandwidth, include CRT refresh circuitry 221, CPU 222, graphical engine 223, and video drivers 224. Graphic engine 223 can typically operate on two areas of the memory at the same time (a source and a destination), thus these engines effectively add two sources which compete for the memory bus: a source read operation and destination read/write operation. Once again, these graphic memory systems operate in the page mode in order to improve memory bus bandwidth, utilizing FIFOs for each read source or write source. However, switching between sources still most likely will require a random cycle (RAS Strobe), with its attendant decrease in memory bus bandwidth.

Today's graphic systems mix graphic with video, introducing another source to compete for the graphic memory bus bandwidth, the video. Video itself can also be considered as two sources, one to update the video portion of the frame buffer, while the second, depending on implementation, is to fetch the video data to display or to fetch some sort of mask for updating and/or displaying the video data. In addition, today's graphic engines can operate on more than just two maps (source and destination), sometimes up to four maps (source, pattern, mask and destination). As shown in FIG. 2, a dedicated FIFO is required for each source, and more random cycles are encountered with each switch between the possible sources requiring access to the memory bus, effectively reducing the total bandwidth of the graphic memory system.

Due to the high bandwidth high color depth requirements, today's graphic system usually employs a 64-bit bus architecture and requires from 2 to 4 Megabytes of memory. A cost effective memory system should have low chip count, be quite flexible and upgradable. Thus, wide and shallow memories are preferred over narrow and deep memories. To increase bandwidth, faster page cycle is always the most important criteria. Maintaining page cycle is the next most important criteria. Graphic controllers can improve the likelihood that page mode operation can be maintained by the use of multiple (or wider) FIFOs to store more words when a memory row is accessed, but this can be extremely costly, especially when each FIFO is 64-bit wide and there are 5 FIFOs used with each source. Therefore, some major improvement in graphic memory systems is highly desirable.

A DRAM can be accessed in page mode for one row at a time. Each time a new source claims the memory bus, a random access cycle is likely to be needed, since a different page of memory is almost certain to be accessed. This random access cycle is followed by one or more page cycles. The number of page cycles possible once a given page is selected by the random access cycle is the defined by the depth of the internal FIFO for that source of the graphic controller. When only one source is accessing the memory, then the maximum number of page cycles per row can be achieved. This number is limited to the number of columns in the memory array.

Traditional DRAM uses only one sense amplifier per memory core to store the selected row data, as shown in FIG. 2. "Sense amplifier register" register 202, which acts as a cache line for memory array 203, can typically be accessed three times faster than a random access cycle of memory array 203. For a 256 k×16 DRAM, the cache line size is typically 512×16. Since there is only one line of cache available, the hit rate for this architecture is very low especially when multiple row addresses are accessed.

Memory interleaving is one prior art technique that can improve page cycle utilization with the conventional DRAM, by increasing the number of cache lines (FIG. 3). In this example, the memory array is divided into two integrated circuits serving as 4 megabit memory arrays 303-even and 303-odd, respectively, each having a 512×16 sense amplifier (row) register serving as a cache line. The two cache lines increase the hit rate significantly when alternate row address from the two memory arrays are accessed. However, when the two rows of data are accessed from the same memory array, the hit ratio is the same as that of the traditional DPAM architecture.

Memory interleaving can double the maximum number of page cycles per row, since even and odd display lines are assigned to opposite memory banks, and accessing between consecutive lines can remain in page cycle. When there is a page miss, the RAS precharge time can be hidden if accessing alternates banks.

Memory interleaving, however, still has many disadvantages: it requires more memory, multiple accesses to the even or odd display lines still result in page miss, and interleaving still does not address the likelihood of a page miss whern there is a change of the source of accessing memory (i.e. graphic controller requests data from two different locations of the even line or odd line bank would likely cause a page miss).

FIG. 4 is a block diagram of a prior art memory circuit including memory controller 210, memory bus 211, and dual page memory 401. Dual page memory includes two memory array banks 401-1 and 401-2, each having an associated sense amplifier register 402-1 and 402-2, respectively. In this prior art circuit 400, dual page memory 401 is formed as a single integrated circuit organized into two discrete memory array banks 401-1 and 401-2, with sense amplifier register 402-1 being dedicated to reading and storing data associated with the first data array page 401-1. Similarly, sense amplifier 402-2 is dedicated to reading and storing information associated with the second data array page 401-2. This prior art memory circuit improves bandwidth somewhat, as a page of memory can be stored from first memory array bank 401-1 for subsequent page reads from sense amplifier 402-1 without interfering with similar page reads from sense amplifier register 402-2 with respect to data obtained from memory array bank 401-2. However, whenever a new page stored within either one memory array banks 401-1 and 401-2 is to be accessed, memory device 401 will have a page miss, requiring a RAS operation to load that new page into the appropriate one of the sense amplifier registers 402-1 and 402-2. An extension of this architecture is to further divide the main core to smaller cores. This reduces the chance of cache "miss". This implementation is very similar to increase the cache size in direct map cache.

SUMMARY

In accordance with the teachings of this invention, a memory system is taught which is able to simultaneously access multiple rows in page mode operation. The multiple page memory of this invention includes a memory array with multiple internal read registers to improve the effective page cycle time. The read registers also improve the page cycle time over conventional DRAM. The multiple page memory of this invention is very effective in graphics applications where multiple page memory access is required. A memory with random access in accordance with this invention greatly enhances performance by allowing different sources to continue to access the memory in the page mode, in spite of intervening memory accesses by other sources to other rows of the memory. A VRAM with random access in accordance with this invention provides an even higher performance graphic memory system.

DETAILED DESCRIPTION

Figure 1:
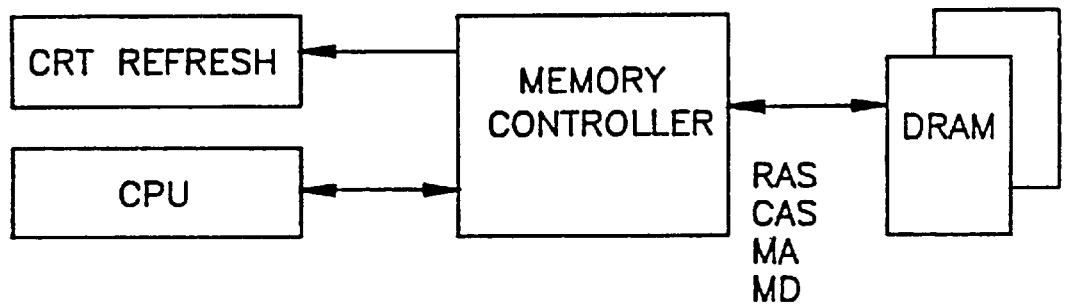
FIG. 1 is a diagram of a prior art memory system.
Figure 4:
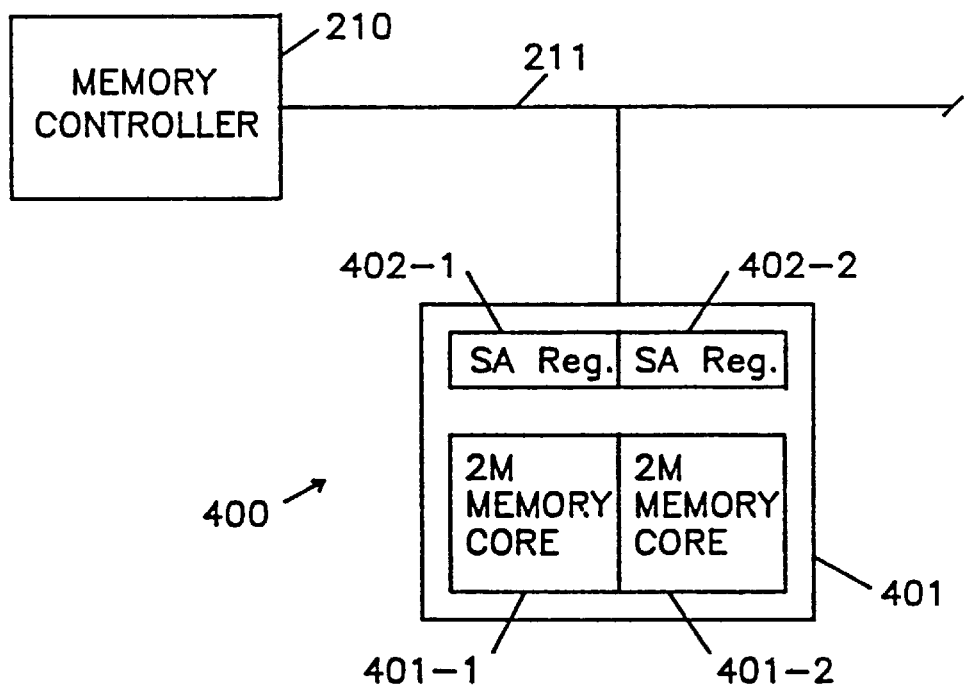
FIG. 4 is a diagram depicting a prior art memory in which an integrated circuit includes two memory cores, each with an associated sense amplifier register.
Figure 2:
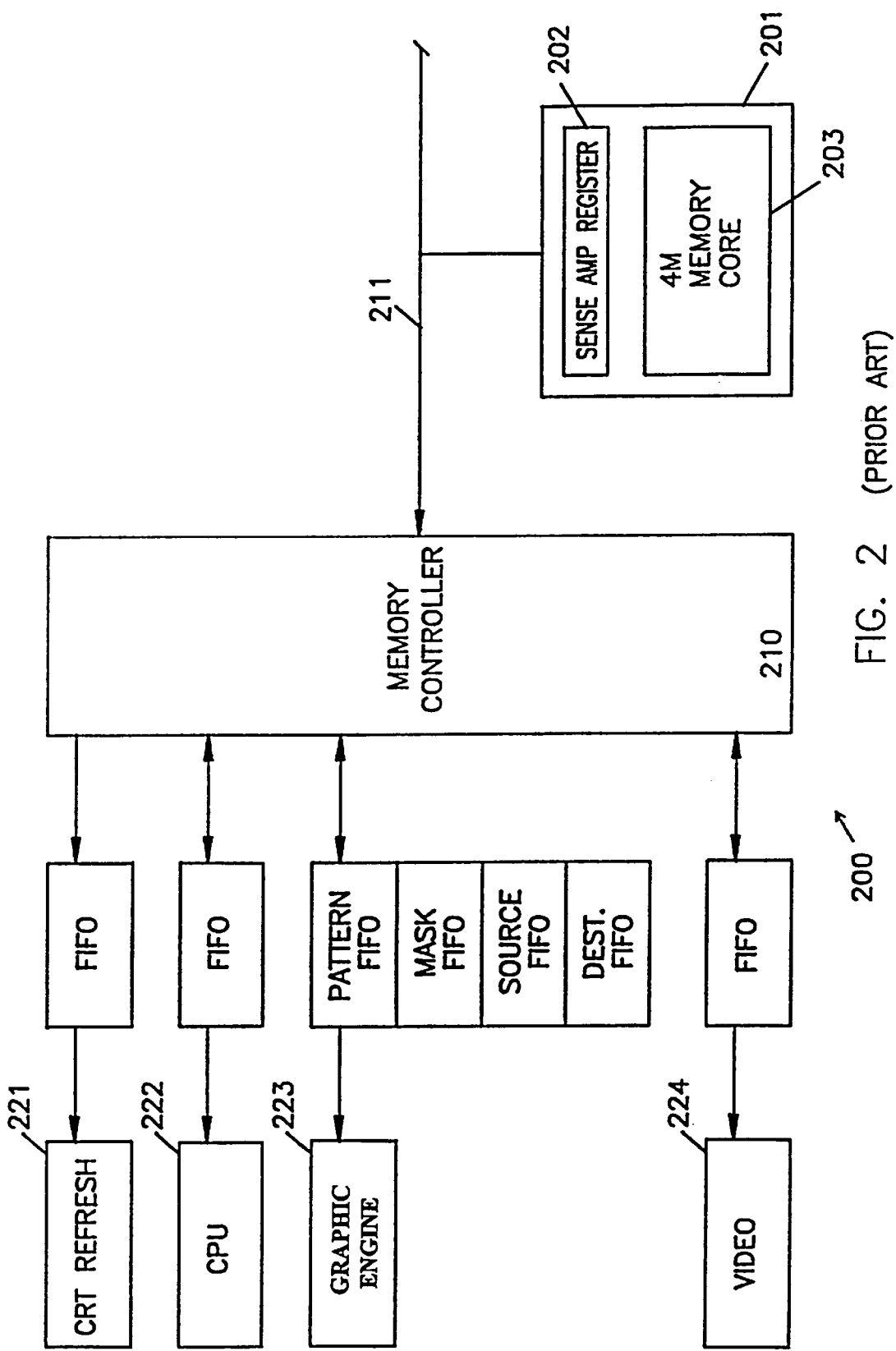
FIG. 2 is a diagram of a prior art memory system showing in more detail a number of sources competing for memory bandwidth.
Figure 3:
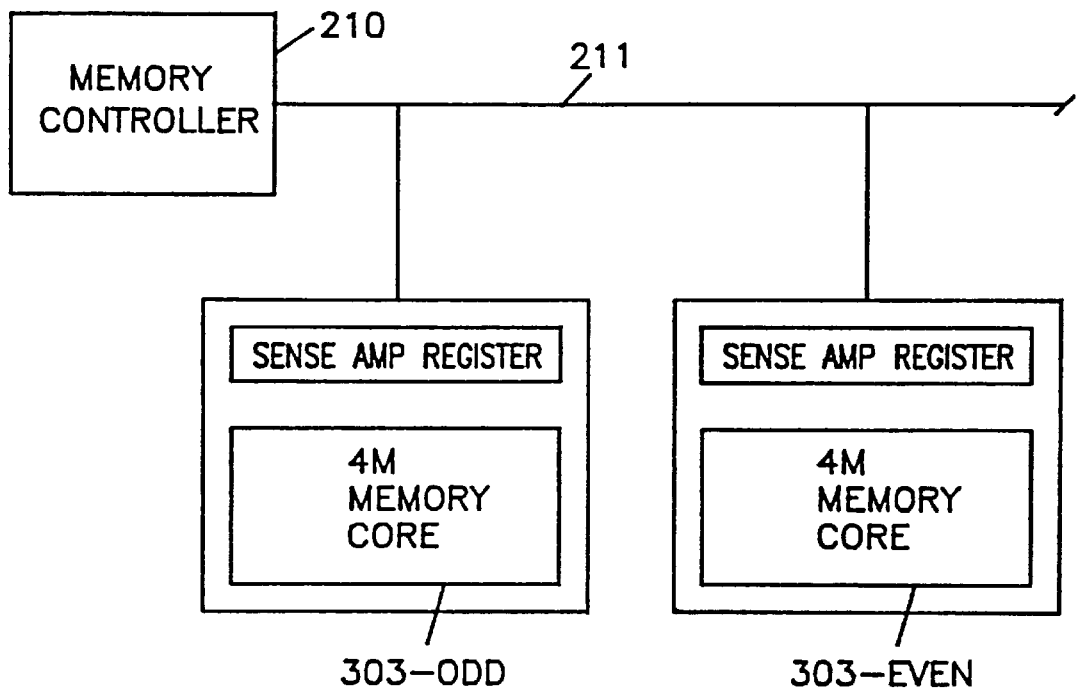
FIG. 3 is a diagram of a prior art interleaved memory system.
Figure 5:
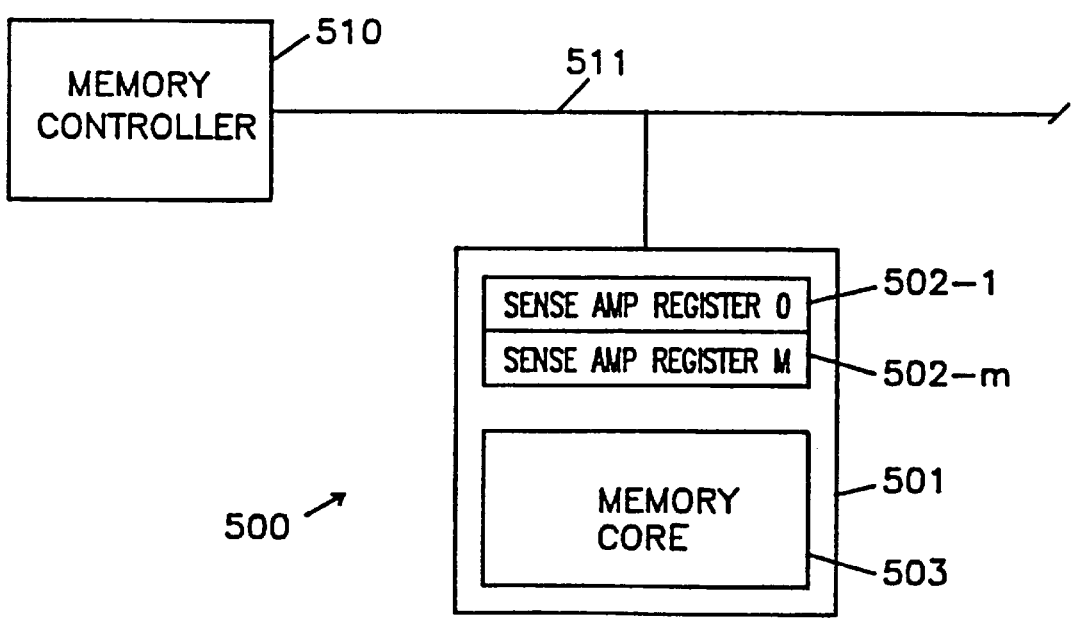
FIG. 5 is a diagram depicting one embodiment of a multiple page memory constructed in accordance with the teachings of this invention.

The architecture of this invention uses multiple row registers for a single memory array to increase the hit ratio. FIG. 5 shows one embodiment of a multiple row register implementation of the multiple page memory of this invention, in which memory 501 includes a memory array or "core" 503, and a plurality of sense amplifier registers 502-1 through 502-M, each being capable of sensing and storing data from any desired location within memory array 503. In one embodiment, for a 256 k×16 DRAM, there are two cache lines of 512×16 row registers 502-1 and 502-2. These two registers do not have row address restrictions like the registers in the prior art interleaving scheme discussed above, making this embodiment of the present invention emulate, to a certain degree, a two-way set association cache. An alternative embodiment of the present invention emulates, to a certain degree, a four-way set association cache by including four cache line registers 502-1 through 502-4, or alternatively by splitting the memory into two smaller memory arrays, each having a set of dual-page registers.

Figure 6:
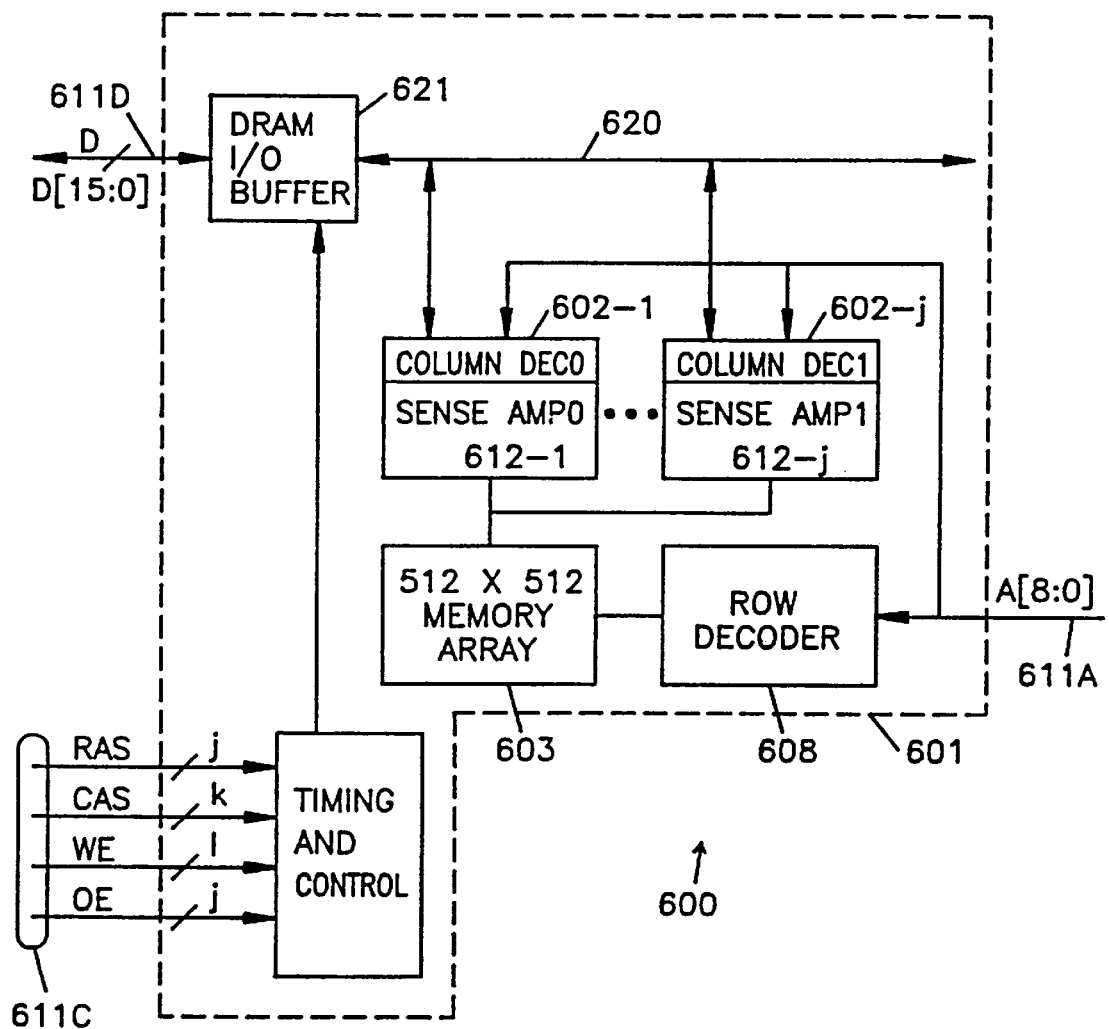
FIG. 6 is a more detailed diagram depicting one embodiment of a multiple page memory of this invention.

FIG. 6 is a block diagram of a memory system 600 of one embodiment of this invention, but for simplicity not showing its memory controller (which may be formed as part of a CPU, graphics controller, or the like, if desired). Memory system 600 includes memory bus 611 to which one or more multiple page memories 601 are coupled (for example the single such multiple page memory 601 shown in FIG. 6), which memory bus 611 includes a data portion 611D, and address portion 611A, and a control signal portion 611C. Each one of a possible plurality of multiple page memories 601 has a plurality of memory pages 602-1 through 602-j which are capable of being accessed without interfering with the information stored in other ones of the memory pages. Each of the plurality of multiple page memories 601 need not have the same number of memory pages. Memory control signal bus 611C includes a plurality of RAS lines RAS-1 through RAS-j corresponding to the j sense amplifier registers 602-1 through 602-j, and a plurality of CAS lines CAS-1 through CAS-j, corresponding to a plurality of j column decoders 602-1 through 602-j, each word being defined by the column address signals and read out from the appropriate sense amplifier register in response to an appropriate one of the CAS signals. The multiple page architecture of this invention allows multiple accesses to any desired number j of address rows to be in page cycle simultaneously, by including a plurality of j sense amplifier registers 502-1 through 502-j associated with a single memory array 603, and thus alleviates to a significant degree the problem of bandwidth reduction caused by multiple sources accessing the memory, with their inherent likelihood of accessing different memory pages. In multiple page memory 601 of this invention, the RAS precharge time can be hidden by accomplishing the RAS strobe simultaneously with the CAS strobe of a frame buffered page which is not being changed. Furthermore, the multiple page memory of this invention can have larger effective page size, because the available row registers are j times that of a conventional memory which has only a single row register.

In addition to the control signals described above, memory system 600 of FIG. 6 also includes one or more write enable signals, each being associated with one of the sense amplifier registers 602-1 through 602-j to allow the information stored in that sense amplifier register to be written to memory array 603. In one embodiment of this invention, in order to minimize complexity, less than all of the j sense amplifier registers 602-1 through 602-j have an associated write enable signal, so that only a subset of j of the sense amplifier registers are capable of writing their data to memory array 603. In one embodiment, for the ultimate in simplicity, only a single one of the sense amplifier registers 602-1 through 602-j includes a write enable line. As is well known in the art, when a plurality of memories 601 are connected to bus 611, appropriate address lines are included on bus 611 and output enable circuitry included within each memory circuit 601 to allow an appropriate one of the memories 601 to be enabled at any given time in response to address signals from a memory controller (not shown).

In one embodiment of this invention, when a plurality of p memory circuits 601 are included in memory systems 600, a plurality of up to j RAS lines are used for each such memory 601, where j is the maximum number of sense amplifiers contained in any one of the memories 601. In this embodiment, the number of RAS signals can include a plurality of p times j RAS signals RAS-1-1 through RAS-p-j. If desired, these RAS signals can be encoded to require fewer RAS lines, with appropriate decoding circuitry used either within an integrated circuit memory 601 or external to it to decode the RAS lines to provide the appropriate RAS control signals for each of the memories. Alternatively, the same RAS signals can be applied to each of the memories 601, with specific memory selection being accomplished via selected ones of the address of bits applied on address bus 611A.

Preferably all timing parameters are multiples of a standard clock period, i.e., 33 MHz, 50 MHz, 66 MHz, 75 MHz & 100 MHz. For example, if $t_{MCLK}$ is the period of a reference clock, $t_{PC}$ is the page cycle time, $t_{RAC}$ is the RAS access time, and $T_{RC}$ is the random read/write cycle time, then $t_{PC}=A*t_{MCLK}$, $t_{RAC}=B*t_{MCLK}$, $T_{RC}=C*t_{MCLK}$, where A, B and C are any integers. For example, when $t_{MCLK}=15$ ns, A=2, B=3, and C=5 are good values.

In one embodiment of this invention, when the multiple page memory of this invention is formed of dynamic random access memory (DRAM), it includes auto-refresh circuitry similar to that known in the prior art, in order to ensure the integrity of the data stored in the DRAM even if an externally supplied refresh signal is not made available during the required time period.

In one embodiment of this invention, a cost effective yet high performance multiple page memory is taught which fits well into today's typical 64 bit upgradable graphic memory system. This embodiment includes a plurality of memory pages available for reading, but a single memory page available for writing. In one embodiment, two memory pages are available for reading. A typical exemplary memory configuration for this embodiment 256 k×16 bits, with 9 bit×9 bit addressing preferred, although 10 bit×8 bit addressing is acceptable to save gates.

Referring to FIG. 6, interface signals for this exemplary embodiment include:

RAS-j—Row address strobes for j memory pages
CAS-j—Column address strobes for j memory pages
WEH—Write enable strobe for the 8 bit high order byte of the selected page
WEL—Write enable strobe for the 8 bit low order byte of the selected page OE-p—Data output enable for a selected one of p integrated circuit memories in a memory system A[9:0]—These are time multiplexed pins for the row and column address D[15:0]—16-bit data bus Multiple page memory 600 includes memory array 603 accessed by row decoder 608 and a plurality of column addressing circuits 602-1 through 602-j. As is known in the prior art, row decoder 608 is responsive to row address signals received on the address portion 611A of memory bus 611. The plurality of column addressing circuit 602-1 through 602-j are responsive to column address signals received on address bus 611A and latched by an appropriate one of the plurality of column address strobe signals CAS-j. Each column address circuit 602-1 through 602-j includes sufficient circuitry to allow for reading of a plurality of columns contained within a selected page of memory array 603, i.e. sense amplifiers, column decoders, and data output buffers. In addition, a selected one or more of the column address circuits 602-1 through 602-j also includes circuitry allowing for the writing of data to memory array 603, i.e. data output buffer and write control circuitry. Each of the column address circuitries 602-1 through 602-j are connected via data bus 620 to the data portion 611D of memory bus 611 via data I/O buffer 621 for buffering data between data bus 620 and memory bus 611.

Figure 7A:
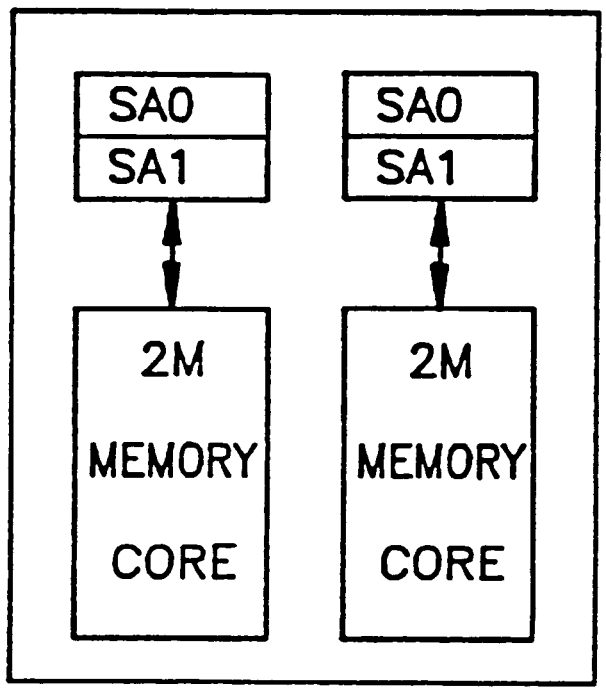
FIGS. 7A through 7C are diagrams depicting various geometries of multiple page memories constructed in accordance with the teachings of this invention.
Figure 7B:
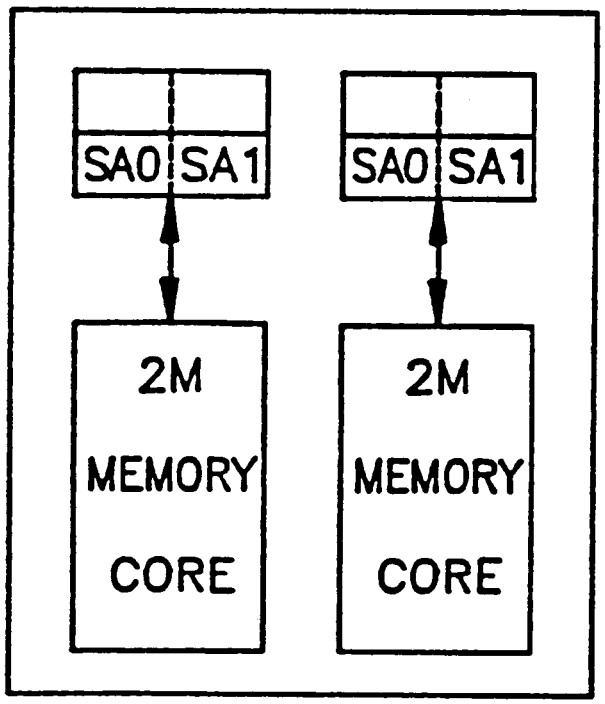
Figure 7C:
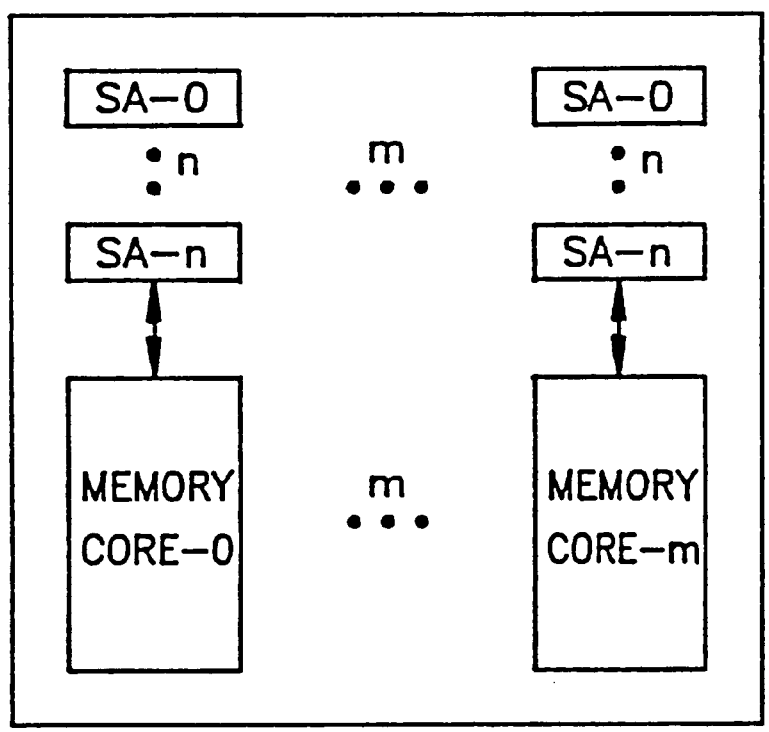

FIGS. 7A through 7C depict various alternative geometries of a multiple page memory constructed in accordance with this invention, illustrating the flexibility of this invention. Naturally, other geometries are available in accordance with the teachings of this invention and may have their own distinct advantages in particular applications. As shown in FIG. 7A, a four megabyte memory core is divided into two separate two megabyte memory cores contained within the same integrated circuit, each memory core including a plurality of sense amplifier registers associated with that memory core, and being of the same bit width as the memory core. In this embodiment, using appropriate address signals an entire selected row from a memory core is stored in a sense amplifier register for access in the page mode. FIG. 7B depicts an alternative geometry of this invention, in which a memory core contained within an integrated circuit is divided into a plurality of memory cores. Each memory core has associated with it a plurality of sense amplifier registers, each sense amplifier being of a width which is a fraction of the width of its associated memory core. Thus, a memory core of, for example, 512 bit width might have associated with it a plurality of sense amplifier registers, including one or more high order sense amplifier registers and one or more low order sense amplifier registers, each sense amplifier register being of 256 bit width. This embodiment has an advantage in that the physical size of a sense amplifier register of a given width is larger than a memory core row of the same number of bits. Thus, this embodiment allows easier placement of sense amplifier registers and memory core on an integrated circuit. In this embodiment, the fractional row length width sense amplifier registers are referred to as being in different channels, for a half row width amplifier configuration, a high order channel and a low order channel.

FIG. 7C is a diagram depicting a generic geometry of a multiple page memory constructed in accordance with the teachings of this invention. The single integrated circuit is formed of a plurality of memory cores, each having associated therewith a plurality of up to N sense amplifier registers. If desired, some or all of these N sense amplifier registers can be of fractional row widths, as discussed above with reference to FIG. 7B. Increasing the number of memory cores for given memory size provides finer granularity, increasing the number of pages available for a given memory size.

Figure 8:
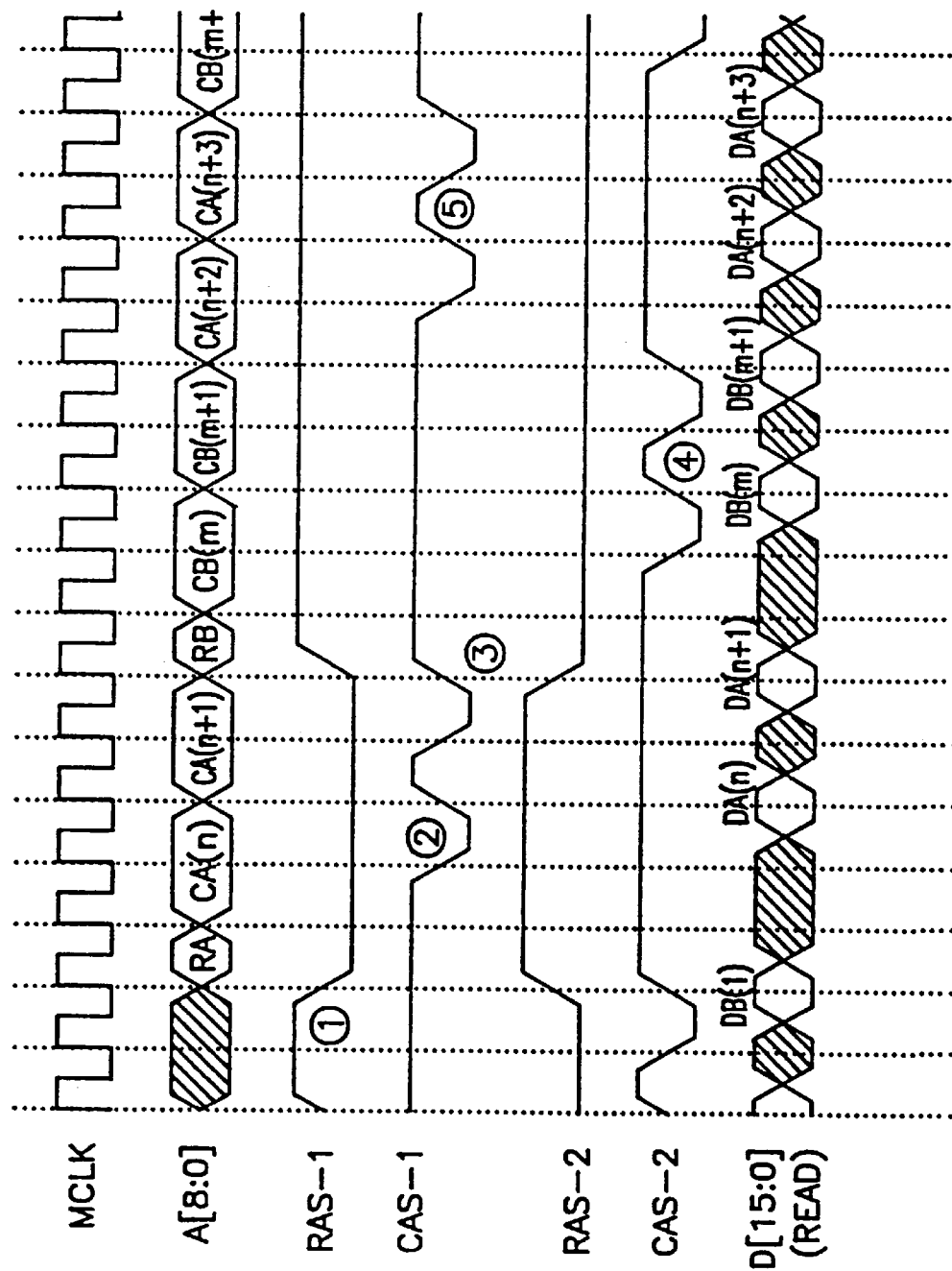
FIG. 8 is a timing diagram depicting read only cycles of one embodiment of the memory of FIG. 6.

Referring to FIG. 8, a typical timing sequence of operation for a memory read operation is shown, for an exemplary embodiment shown in FIG. 6 having two row registers 602-1 and 602-2 responsive to RAS signals RAS-1 and RAS-2, and CAS signals CAS-1 and CAS-2, respectively. In FIG. 8, Mclk is shown only as a system design reference, and it is to be understood that consecutive page cycles do not necessarily have consecutive address, or incrementing order. Only one RAS line may be active at any given time, in order to prevent two rows from being selected at the same time. As shown in FIG. 8, 1. RAS-1 drops, selecting row A defined by current address information, and thus causing the data in row A to be latched in the appropriate one of the row registers 602-1 and 602-2.
2. CAS-1 toggles, reading row A data.
3. RAS-2 drops, selecting row B while CAS-1 toggles, hiding the RAS-2 precharge as the RAS-2 precharge takes place simultaneously with a CAS-1 read.
4. CAS-2 toggles, CAS-1 remains unchanged, reading row B.
5. CAS-1 toggles, CAS-2, remains unchanged, returns to reading row A without a new precharge for row A.

Figure 9:
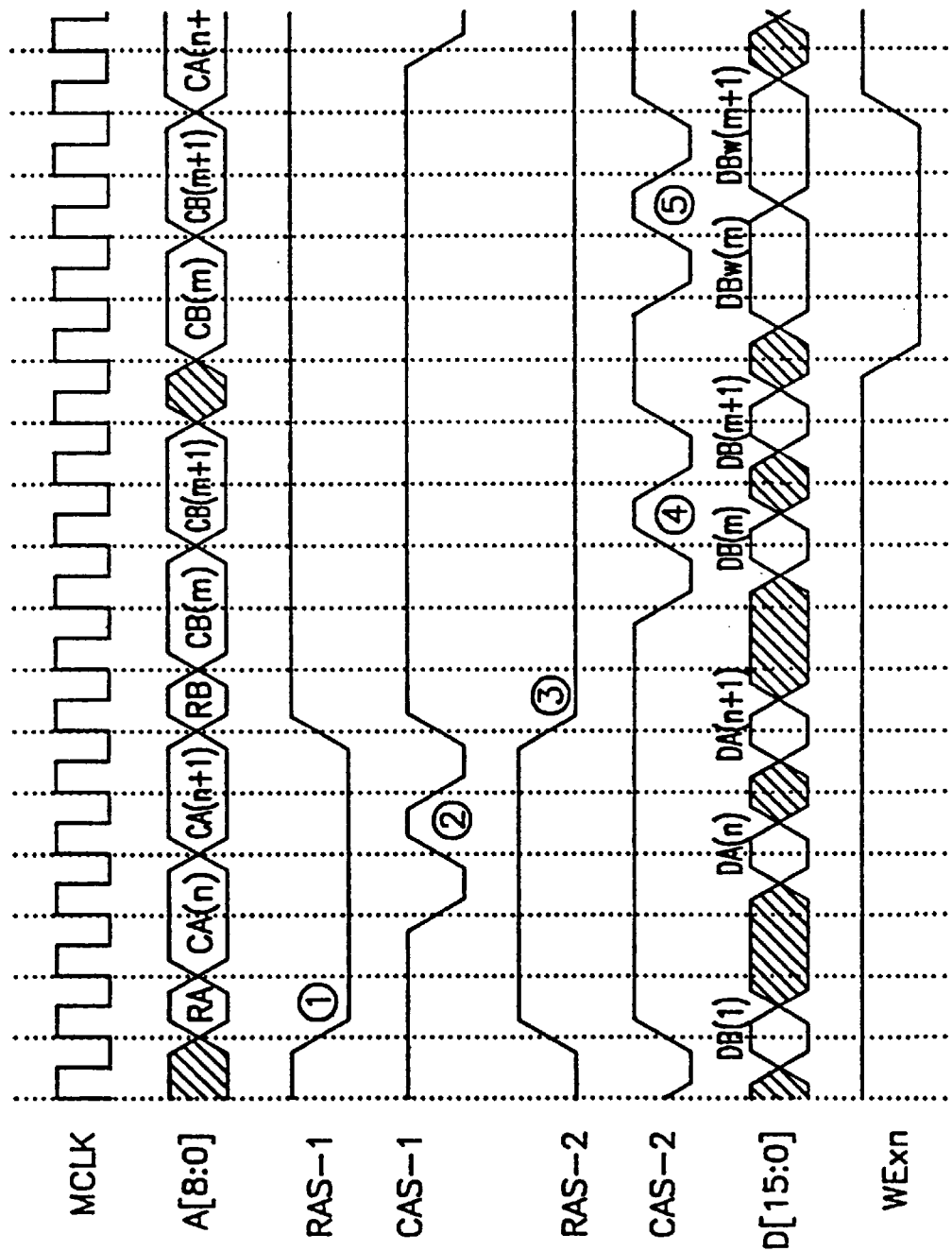
FIG. 9 is a timing diagram depicting read and write cycles of one embodiment of a memory system of FIG. 6.

FIG. 9 is a timing diagram depicting operation for a memory read/write operation for the same exemplary embodiment of FIG. 6. As shown in FIG. 9, 1. RAS-1 drops, selecting row A defined by current address information, and thus causing the data in row A to be latched in the appropriate one of the row registers 602-1 and 602-2.
2. CAS-1 toggles, reading row A data.
3. RAS-2 drops, selecting row B while CAS-1 toggles, hiding the RAS-2 precharge as the RAS-2 precharge takes place simultaneously with a CAS-1 read.
4. CAS-2 toggles, CAS-1 remains unchanged, reading row B.
5. CAS-2 toggles, CAS-1 remains unchanged, WE drops, returns to writing row B without a new precharge for row B.

In one embodiment, a single row register is capable of writing data to memory array 603, thereby minimizing circuitry. In this embodiment, whenever a read only row register and the read/write row register have the same row addresses, all reads come from read/write row register to avoid a coherency problem. This is accomplished by including an address tag associated with each row register, and determination circuitry which indicate if the two tags match, in which case read data is forced to be generated from the read/write row register.

Figure 10:
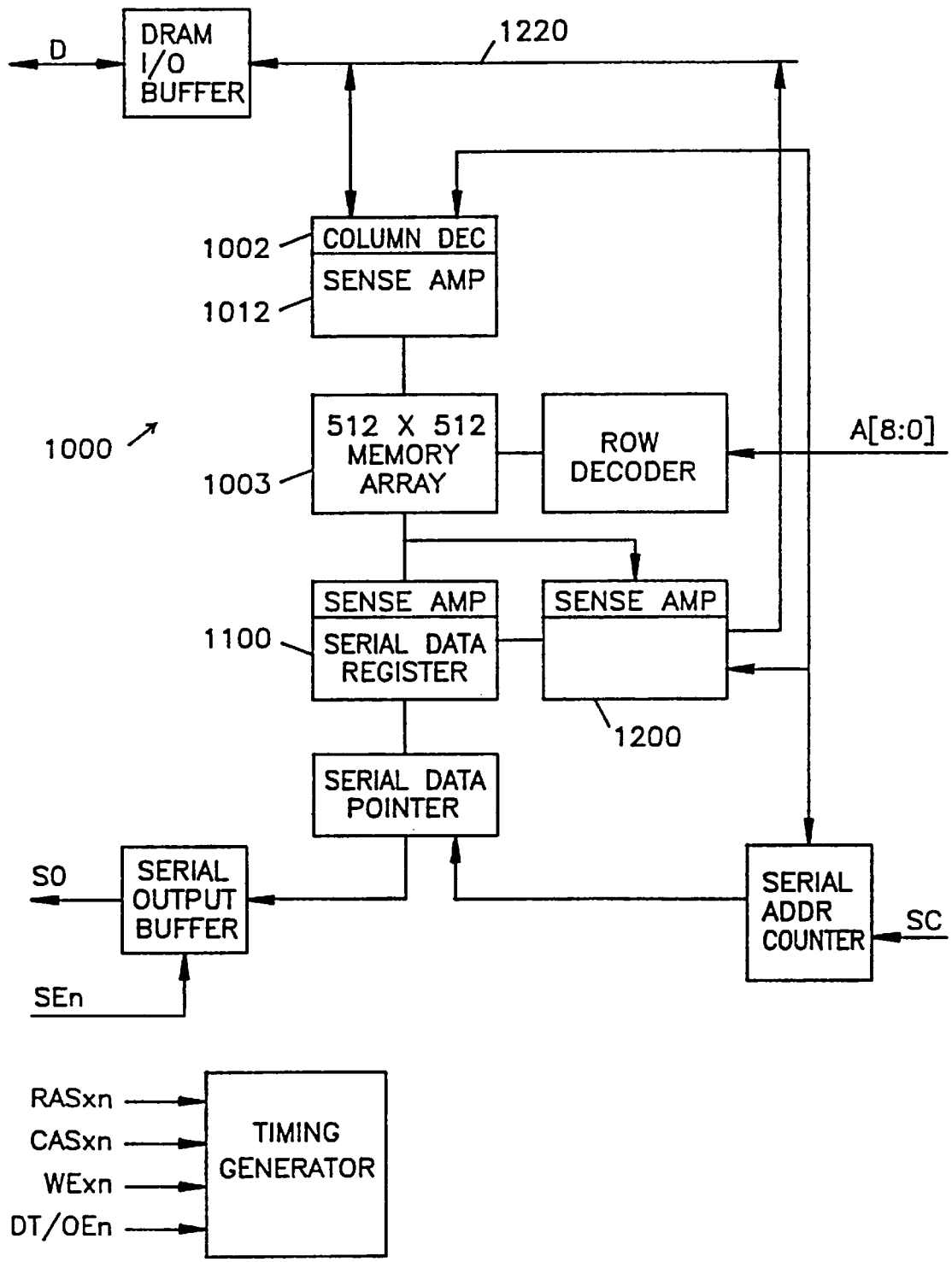
FIG. 10 is a block diagram depicting one embodiment of a multiple page VRAM constructed in accordance with the teachings of this invention.

FIG. 10 is a block diagram depicting one embodiment of a multiple page video RAM (VRAM) constructed in accordance with the teachings of this invention. Multiple page VRAM 1000 includes memory array 1003, and one or more sense amplifier 1012 and associated column decoders 1002 for accessing memory array 1003 in a normal DRAM cycle. VRAM 1000 also includes serial data register 1100 with its associated sense amplifier. Serial data register 1100 reads data from memory array 1003 during a VRAM cycle for serial data output, as is known in the art. In accordance with the teaching of this invention, an additional one or more VRAM registers 1200 and an associated sense amplifier is provided to allow for additional data to be read from memory array 1003 during a VRAM cycle and made available in parallel on data bus 1220, thereby allowing a plurality of pages to be read from memory array 1003, and accessed in the page mode simultaneously. If desired, one or more of these additional VRAM registers 1200 can be configured to provide serial output data in addition to the serial output data provided by serial data register 1100. By providing a plurality of VRAM registers 1200, integrated circuit surface area is saved as compared with the duplication of sense amplifier 1012 in order to provide a plurality of memory pages for simultaneous operation.

Figure 11:
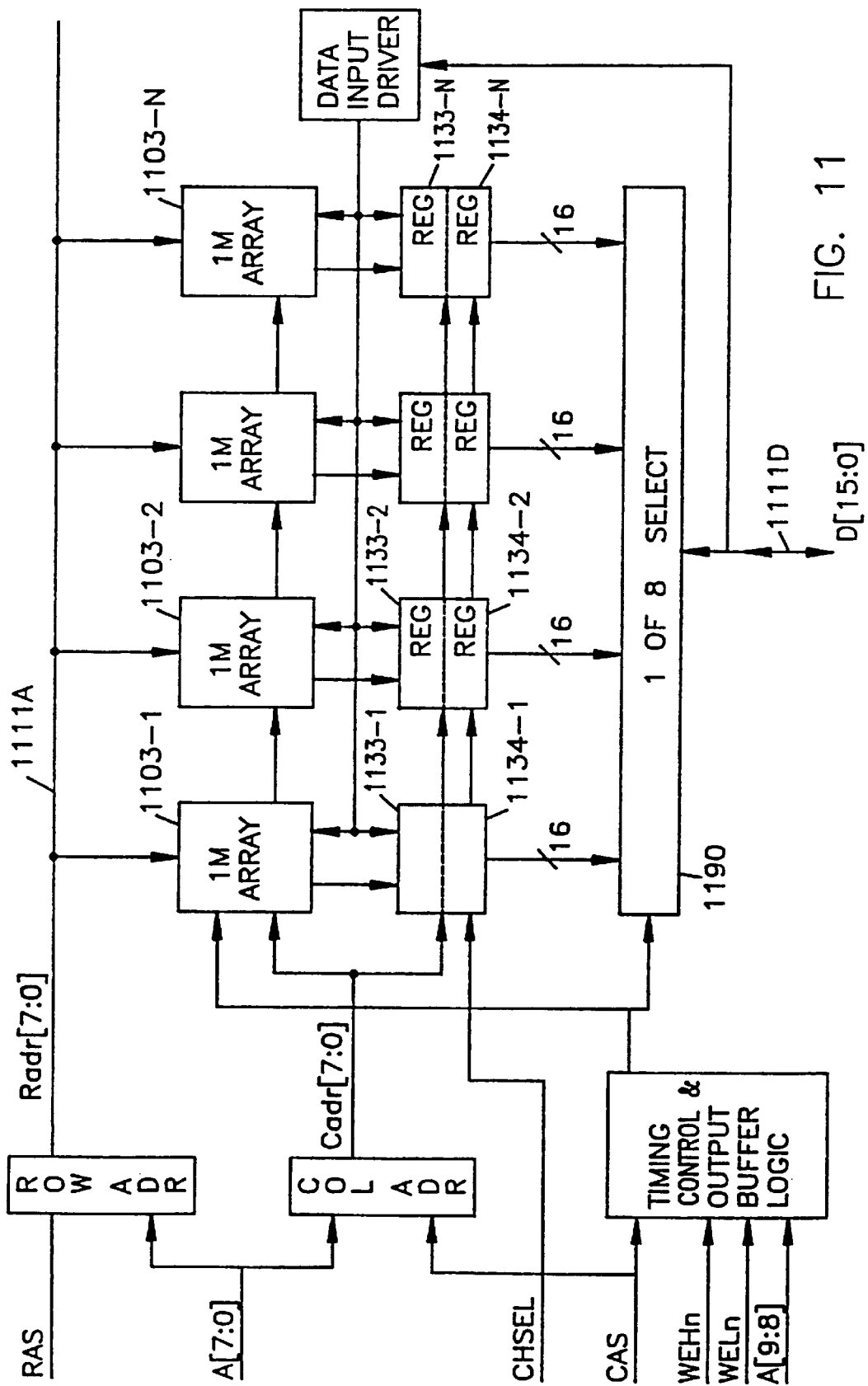
FIG. 11 is a block diagram depicting one embodiment of a multiple page memory of this invention including a plurality of multiple page registers.

FIG. 11 shows a block diagram of a multiple page memory with a plurality of multiple page registers. The main memory core is divided into n smaller cores 1103-1 through 1103-n. There are a plurality of page registers such as 1133-1 and 1134-1 associated with each memory core. In one embodiment of this invention, there are four memory arrays 1103-1 through 1103-4, each of size 256×256×16 and each page register 1133 and 1134 is of size 256×16, providing an effective cache size for this embodiment of 8×256×16, is eight times that of a conventional DRAM. Naturally, it will be appreciated that this invention allows the use of any number of memory arrays 1103, as well as any number of page registers 1133, 1134, and also that some or all of the page registers can be of fractional width of their associated memory arrays.

Access of the embodiment of FIG. 11 is very similar to that previously described, where the RAS signal is used to strobe the row address and the CAS signal is used to strobe the column address. There are two types of page register read cycles, the page register transfer cycle and the page register read cycle.

The register transfer cycle is initiated by the falling edge of RAS with WE inactive. The row addresses are used to select which row in the memory core will be loaded into one of the page registers selected by a channel select signed CHSEL, which is provided by a controller (not shown) based upon any desired criteria, such as the greatest period of inactivity of the page registers associated with the memory array to be read. If the page register selected contains previous valid data, it is overwritten. It is the responsibility of the controller (discussed later with reference to FIG. 12) to manage the use of the page registers.

The register read cycle is very similar to a page CAS cycle, except RAS is don't care and CHSEL and the MSB of the column addresses are used to select wnich read register to read from.

During a write cycle, data is transferred to the memory core from a page register in the same manner as previously described. In one embodiment, the page registers are not updated automatically to maintain coherency with the memory core, but rather the controller is responsible for loading the updated row to the page register when the write row address matches the row address for one of the page registers.

Figure 12:
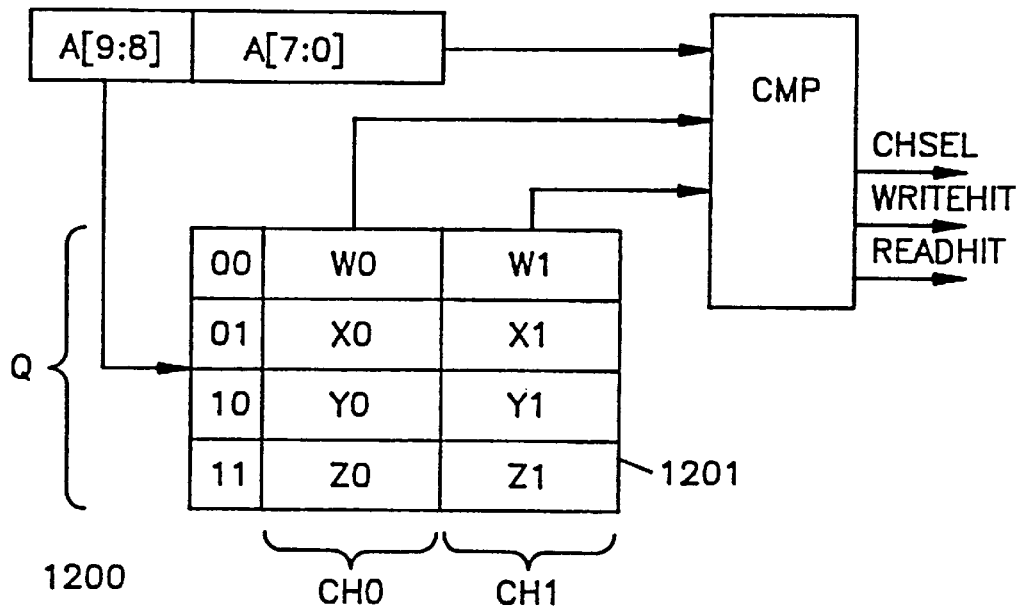
FIG. 12 is a diagram depicting one embodiment of a memory controller suitable for use with the circuit of FIG. 11.

FIG. 12 is a diagram depicting one embodiment of a memory controller suitable for use with the embodiment of FIG. 11. When the embodiment of FIG. 11 includes four memory arrays 1103-1 through 1103-4, each having two page registers associated therewith, memory controller 1200 is implemented as a two-way set associative cache (i.e., two page registers per memory array) with four entries (i.e., four memory arrays). Tag memory 1201 includes a plurality of Q rows of entries, each row including N columns, where N is the number of page registers per memory array, and Q is the number of memory arrays. In the example shown, tag memory 1201 includes four rows, each associated with one of the four memory arrays 1103-1 through 1103-4 of this example, each row including two entries, each associated with one of the two page registers associated with each memory array. The sets of row address tags are kept to determine whether a memory access hits the row registers. For a given row of entries in tag memory 1201, the row addresses are compared in both the read and write cycle for the associated one of the memory arrays. During a write cycle, if one of the row addresses matches the tag (a "tag hit"), the read register is reloaded with WE inactive at the falling edge of RAS; conversely, upon a tag "miss", WE is active at the falling edge of RAS so that the contents of the read register are unaltered. During a read cycle, no register reload is needed in response to a tag hit, but in the event of a tag miss, the read register is loaded with data from its memory array.

Figure 13:
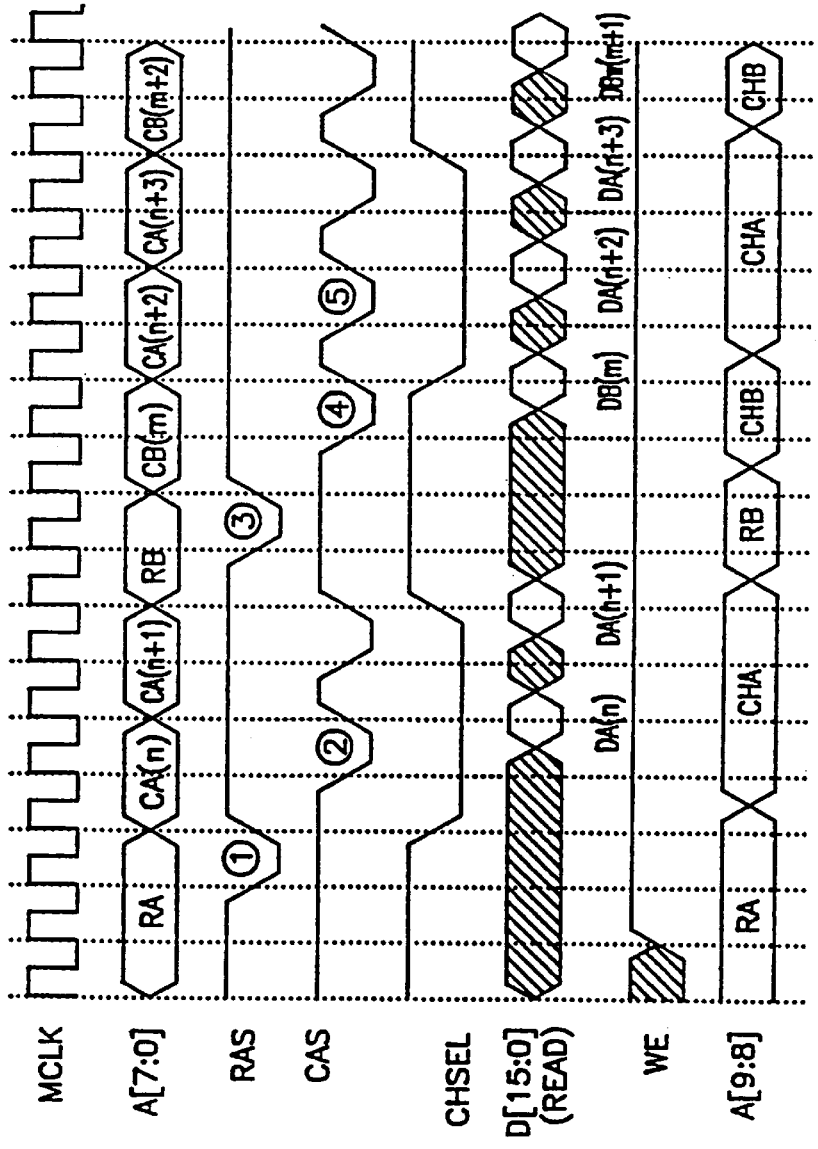
FIG. 13 is a timing diagram depicting read only operation of one embodiment of the memory of FIG. 11.

FIG. 13 is a timing diagram depicting an example of a read sequence for operating the embodiment of FIG. 11. As shown in FIG. 13, 1. RAS drops; is WE high. Row A data is loaded into row register A selected by CHSEL=0 and A[9:8]. Up to 8 row registers can be selectively accessed with a combination of signals CHSEL and A[9:8]
2. CAS toggles with CHSEL=0 and A[9:8] reading row A data.
3. RAS drops; is WE high. Row B data is loaded into row register B selected by CHSEL=1 and A[9:8].
4. CAS toggles, reading row B data selected by CHSEL=1 and A[9:8]
5. CAS toggles, CHSEL=0, row A data is selected without a new precharge for row A.

Figure 14:
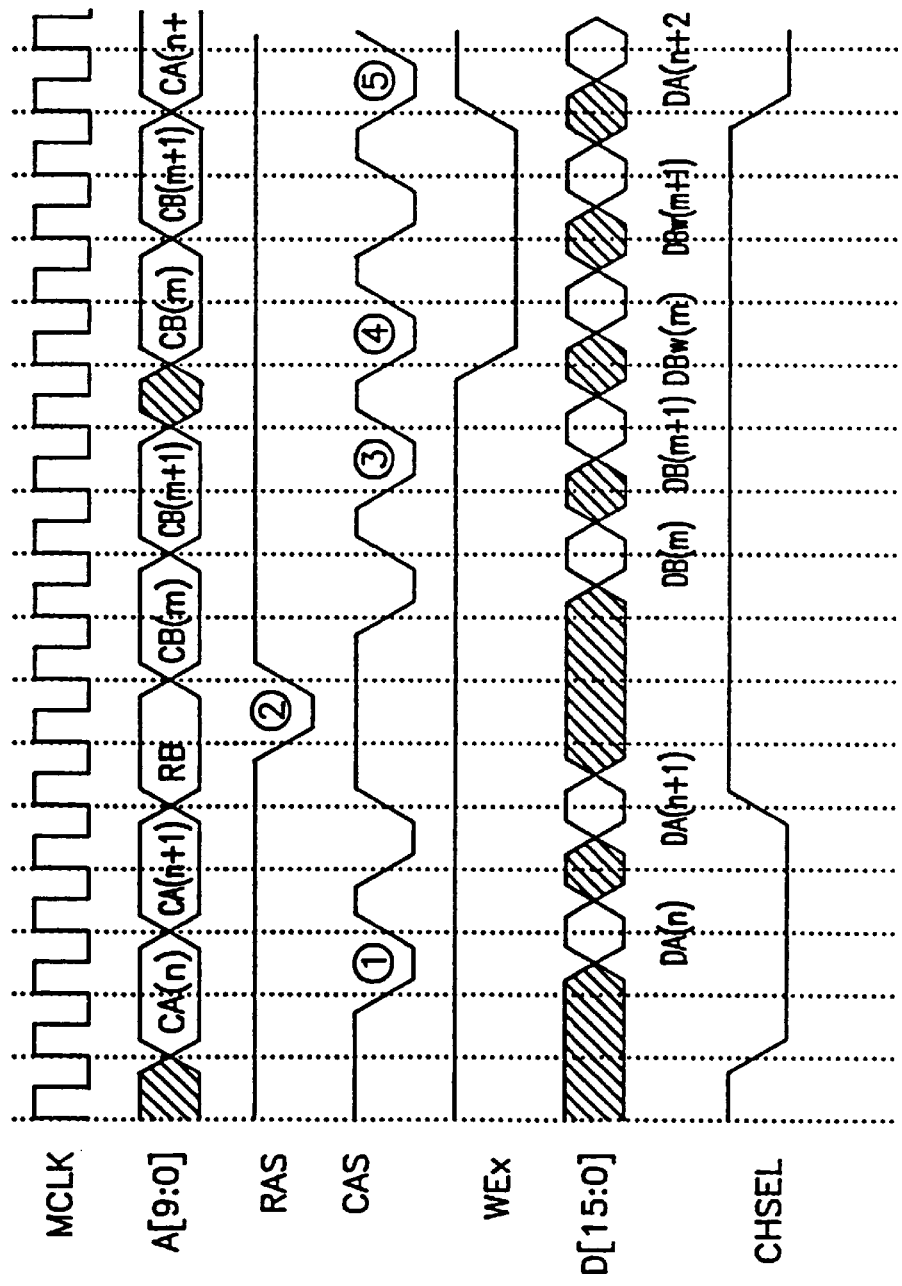
FIG. 14 is a timing diagram depicting read and write operation of one embodiment of the memory of FIG. 11.

FIG. 14 of the timing diagram depicting operation for a memory read/write operation for the same exemplary embodiment of FIG. 11. As shown in FIG. 14, 1. CAS toggles with CHSEL=0 and A[9:8] reading preloaded row A data.
2. RAS drops; WE is high. Row B data is loaded into row register B selected by CHSEL=1 and A[9:8].
3. CAS toggles, reading row B data selected by CHSEL=1 and A[9:8]
4. CAS toggles with WE=0, writing data to memory core selected by A[9:8]. CHSEL does not have any effect because in this embodiment only one page register is a read/write register.
5. CAS toggles, CHSEL=0, row A data is selected without a new precharge for row A.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

What is claimed is:

1. A method for accessing data in a memory, said memory having an address input port for receiving address signals defining physical locations within said memory, a data port, a memory array for the storage of data, said memory array having a plurality of locations arranged in at least one block, each of said at least one block comprising a plurality of rows, wherein data is accessed in said memory array based upon address locations defined by address signals received at said address input port, said method comprising:

causing a desired one of a plurality of sense amplifier read registers associated with each said block of said memory array to store a row of data transferred from said memory array in response to a first subset of said address signals;

causing read register access circuitry to select, in response to a second subset of said address signals, a selected portion of data from the data row stored in said desired one of said plurality of sense amplifier read registers; and providing said selected data to said data port, wherein said selected portion of data is defined by the address defined by said second subset of said address signals.

2. A method as in claim 1, wherein said first subset of address signals comprises row address signals, and each of said sense amplifier read registers is controlled by a unique RAS signal.

3. A method as in claim 2, wherein said unique RAS signals are provided as a plurality of RAS signals.

4. A method as in claim 2, wherein said unique RAS signals are derived from a set of encoded RAS signals.

5. A method as in claim 2, wherein said unique RAS signals are derived at least in part from a portion of said address signals.

6. The method of claim 1 wherein data is read from a first one of said sense amplifier read registers while data is loaded from said memory array into a second one of said sense amplifier read registers.

7. A method for accessing data in a memory, said memory including an address input port for receiving address signals defining physical locations within said memory, a data port, a memory array for the storage of data, said memory array having a plurality of locations arranged in at least one block, each of said at least one block comprising a plurality of rows, wherein data is accessed in said memory array based upon address locations defined by address signals received at said address input port, said method comprising:

causing a desired one of a plurality of page registers associated with each said block of said memory array to store a plurality of rows of data transferred from said memory array in response to a first subset of said address signals;

causing page register access circuitry to select, in response to a second subset of said address signals, a selected portion of data from said data stored in said desired one of said plurality of page registers; and providing said selected data to said data port, wherein said selected portion of data is defined by the address defined by said second subset of said address signals.

8. The method of claim 7, wherein data is read from a first page register of said plurality of page registers while data is loaded from said memory array into a second page register of said plurality of page registers.

9. A method as in claim 1, wherein said memory array comprises a plurality of memory subarrays, each said memory subarray having associated therewith rows of data and a plurality of said sense amplifier read registers which are capable of sensing and receiving data only from its associated one of said memory subarrays.

* * * * *